United States Patent
Kang et al.

(10) Patent No.: US 11,957,057 B2
(45) Date of Patent: Apr. 9, 2024

(54) CATIO₃-BASED OXIDE THERMOELECTRIC MATERIAL AND PREPARATION METHOD THEREOF

(71) Applicant: DALIAN UNIVERSITY OF TECHNOLOGY, Liaoning (CN)

(72) Inventors: Huijun Kang, Liaoning (CN); Tongmin Wang, Liaoning (CN); Jianbo Li, Liaoning (CN); Zhiqiang Cao, Liaoning (CN); Zongning Chen, Liaoning (CN); Enyu Guo, Liaoning (CN); Yiping Lu, Liaoning (CN); Jinchuan Jie, Liaoning (CN); Yubo Zhang, Liaoning (CN); Tingju Li, Liaoning (CN)

(73) Assignee: Dalian University of Technology, Liaoning (CN)

( * ) Notice: Subject to any disclaimer, the term of this patent is extended or adjusted under 35 U.S.C. 154(b) by 0 days.

(21) Appl. No.: 17/296,942

(22) PCT Filed: Jul. 14, 2020

(86) PCT No.: PCT/CN2020/101807
§ 371 (c)(1),
(2) Date: May 25, 2021

(87) PCT Pub. No.: WO2021/196445
PCT Pub. Date: Oct. 7, 2021

(65) Prior Publication Data
US 2023/0011963 A1    Jan. 12, 2023

(30) Foreign Application Priority Data
Mar. 30, 2020  (CN) .......................... 202010234846.7

(51) Int. Cl.
*H10N 10/855* (2023.01)
*C01G 23/00* (2006.01)
*H10N 10/01* (2023.01)

(52) U.S. Cl.
CPC ......... *H10N 10/855* (2023.02); *C01G 23/006* (2013.01); *H10N 10/01* (2023.02);
(Continued)

(58) Field of Classification Search
CPC .................................................... C01G 23/006
See application file for complete search history.

(56) References Cited

FOREIGN PATENT DOCUMENTS

| CN | 101423243 | 5/2009 |
|---|---|---|
| CN | 104973621 | 10/2015 |

(Continued)

OTHER PUBLICATIONS

Park et al. Electrochemical Properties of Ca1-xLaxTiO3, Journal of Ceramic Processing Research, 2017, vol. 18, No. 4, pp. 336-340. (Year: 2017).*

(Continued)

*Primary Examiner* — Peter F Godenschwager
(74) *Attorney, Agent, or Firm* — JAQUEZ LAND GREENHAUS & MCFARLAND LLP; Bruce W. Greenhaus, Esq.

(57) ABSTRACT

A CaTiO₃-based oxide thermoelectric material and a preparation method thereof are disclosed. The CaTiO₃-based oxide thermoelectric material has a chemical formula of $Ca_{1-x}La_xTiO_3$, where $0<x\leq 0.4$. The present disclosure makes it possible to prepare a CaTiO₃-based thermoelectric material with properties comparable to n-type ZnO, CaTiO₃, SrTiO₃ and other oxide thermoelectric materials. Among them, the La15 sample has a power factor reaching up to 8.2 $\mu Wcm^{-1}K^{-2}$ (at about 1000 K), and a power factor reaching up to 9.2 $\mu Wcm^{-1}K^{-2}$ at room temperature (about 300 K); and a conductivity reaching up to 2015 $Scm^{-1}$ (at 300 K). The CaTiO₃-based oxide thermoelectric material exhibits the best thermoelectric performance among calcium titanate ceramics. The method for preparing the CaTiO₃-based oxide (Continued)

thermoelectric material of the present disclosure is simple in process, convenient in operation, low in cost, and makes it possible to prepare a $CaTiO_3$-based ceramic sheet with high thermoelectric performance.

8 Claims, 3 Drawing Sheets

(52) U.S. Cl.
CPC ...... *C01P 2002/54* (2013.01); *C01P 2002/72* (2013.01); *C01P 2004/03* (2013.01); *C01P 2006/32* (2013.01); *C01P 2006/40* (2013.01)

(56) References Cited

FOREIGN PATENT DOCUMENTS

| | | | |
|---|---|---|---|
| CN | 104973621 | A * | 10/2015 |
| CN | 111377733 | | 7/2020 |

OTHER PUBLICATIONS

English machine translation of Wang et al. CN 104973621 A (Year: 2015).*

Park, et al., "Electrochemical Properties of Ca1-xLaxTiO3 Anode Materials for Solid Oxide Fuel Cells", Journal of Cermaic Processing Research, vol. 18, No. 4, pp. 336-340, 2017.

Guth, et al., "Novel Electrode Materials for Electrochemical Sensors", 2011 Fifth International Conference on Sensing Technology, pp. 685-689.

Goncalves, et al., "Fotoluminescencia E Adsorcao de CO2 Em Nanoparticulas de CaTIO3 Dopadas com Lantanio", Quim. Nova, vol. 27, No. 6, 2004, pp. 862-865.

Shrivastava, et al., "Solid State Synthesis and Structural Refinement of Polycrystalline LaxCa1-xTiO3 Ceramic Power", Bull. Mater. Sci., vol. 27, No. 2, Apr. 2004, pp. 121-126.

The State Intellectual Property Office of People's Republic of China, English translation of Office Action for application No. 202010234846.7.

* cited by examiner ized by the thermoelectric figure of merit, defined as $ZT=S^2\sigma T/\kappa$: where S represents Seebeck coefficient; $\sigma$ represents electrical conductivity; T represents absolute temperature; $\kappa$ represents thermal conductivity, and $S^2\sigma$ is also known as power factor. Accordingly, a high power factor and a low thermal conductivity are needed for good thermoelectric materials.

CATIO₃-BASED OXIDE THERMOELECTRIC MATERIAL AND PREPARATION METHOD THEREOF

CROSS REFERENCE TO RELATED APPLICATION

The application claims priority to Chinese Application No. 202010234846.7, filed on Mar. 30, 2020 with China National intellectual Property Administration, entitled "CaTiO₃-based oxide thermoelectric material and preparation method thereof", which is hereby incorporated by reference in its entirety.

TECHNICAL FIELD

The present disclosure relates to a technical field of thermoelectric materials, and especially to a CaTiO₃-based oxide thermoelectric material and a preparation method thereof.

BACKGROUND

The thermoelectric material is a class of functional materials that can convert heat to electricity and vice versa by movements of its own carriers. These materials have been proposed for use in both power generation and refrigeration. Oxide thermoelectric materials have the advantages of having a simple preparation process, being low in cost, and not contributing to pollution. The performance of thermoelectric materials is usually evaluated by the thermoelectric figure of merit, defined as $ZT=S^2\sigma T/\kappa$: where S represents Seebeck coefficient; $\sigma$ represents electrical conductivity; T represents absolute temperature; $\kappa$ represents thermal conductivity, and $S^2\sigma$ is also known as power factor. Accordingly, a high power factor and a low thermal conductivity are needed for good thermoelectric materials.

As a representative of the earliest discovered perovskite structure, CaTiO₃ compound is widely applied in medicine, photocatalysis, sensors and other electronic fields due to its excellent dielectric, catalysis, biocompatibility, and optical properties. However, its thermoelectric performance has been less studied.

SUMMARY

An objective of the present disclosure is to: (1) address the above problem; and (2) provide a method for preparing a CaTiO₃-based oxide thermoelectric material that is simple, low cost, and that results in a CaTiO₃-based ceramic sheet with high thermoelectric performance.

To achieve the above objective, the present disclosure provides a CaTiO₃-based oxide thermoelectric material having a chemical formula of $Ca_{1-x}La_xTiO_3$, where $0<x\geq0.4$.

In some embodiments, $0.05<x\leq0.3$.

Another objective of the present disclosure is to provide a method for preparing a CaTiO₃-based oxide thermoelectric material, comprising, step (1), dissolving La(NO₃)₃·6H₂O in distilled water and stirring for 5-10 minutes to obtain an aqueous La(NO₃)₃·6H₂O solution;

step (2), dissolving CaCl₂ in distilled water and stirring for 5-10 minutes to obtain an aqueous CaCl₂ solution;

step (3), dissolving NaOH in distilled water and stirring for 5-10 minutes to obtain an aqueous NaOH solution;

step (4), dissolving tetrabutyl titanate in ethylene glycol and stirring for 5-10 minutes to obtain a solution of tetrabutyl titanate in ethylene glycol;

step (5), adding distilled water to the solution of tetrabutyl titanate in ethylene glycol, stirring to obtain a suspension, and adding:(a) the aqueous La(NO₃)₃·6H₂O solution; (b) the aqueous CaCl₂ solution; and (c) the aqueous NaOH solution in sequence, and stifling for 10-15 minutes to obtain a precursor solution, wherein a molar ratio of: (i) La(NO₃)₃·6H₂O (in terms of La); (ii) CaCl₂ (in terms of Ca); (iii) tetrabutyl titanate (in terms of Ti); and (iv) NaOH is in a range of x: (1-x): 1:10, with the proviso that $0<x\leq0.4$, wherein NaOH is used as a mineralizer;

step (6), placing the precursor solution into an autoclave, moving the autoclave into a drying box, and keeping at 160-200° C. for 6-24 hours to obtain a solid product;

step (7), mixing glacial acetic acid and distilled water in a volume ratio of 1:(5-15), and stifling for 3-5 minutes to obtain a mixed solution of glacial acetic acid and distilled water;

step (8), adding the solid product into the mixed solution of glacial acetic acid and distilled water, wherein a ratio of the solid product to the mixed solution is in a range of (2-4) g: 100 mL; stifling, and filtering, to obtain a filter cake, washing the filter cake with distilled water for 3-5 times, and drying, to obtain a La-doped CaTiO₃ powder or a CaTiO₃ powder with a small amount of La(OH)₃; wherein glacial acetic acid is used to neutralize residual NaOH in the solid product; and step (9), sintering the La-doped CaTiO₃ powder in a vacuum hot-pressing sintering furnace at 1300-1600° C. for 1-3 hours, with a vacuum degree of not more than 0.1 Pa, and a press of 10-40 MPa, to obtain a CaTiO₃-based oxide thermoelectric material, also referred as a CaTiO₃-based thermoelectric ceramic material;

wherein steps (1) to (4) are performed in any order; and there is no time sequence limitation between step (7) and any one of steps(1) to (6).

In some embodiments, La(NO₃)₃·6H₂O has a purity of ≥99.99%, CaCl₂ has a purity of ≥99.99%, NaOH has a purity of ≥98%, and tetrabutyl titanate has a purity of ≥99%. Unless otherwise specified, "%" herein represents a mass percentage.

In some embodiments, the aqueous La(NO₃)₃·6H₂O solution has a La(NO₃)₃·6H₂O concentration of greater than 0 and not more than 0.27 mol/L. In some embodiments, the CaCl₂ aqueous solution has a CaCl₂ concentration of 0.4-0.67 mol/L. In some embodiments, the aqueous NaOH solution has a NaOH concentration of 4.5-7 mol/L.

In some embodiments, in step (4), the tetrabutyl titanate solution in ethylene glycol has a tetrabutyl titanate concentration of 0.1-1.5 mol/L.

In some embodiments, a volume ratio of ethylene glycol to distilled water in the precursor solution in step (5) is in a range of (1-3):7.

In some embodiments, a volume ratio of distilled water to ethylene glycol in the suspension in step (5) is larger than or equal to 1:1. In the present disclosure, distilled water is preferentially added to facilitate the formation of CaTiO₃. Otherwise, CaTiO₃ could not be formed and a large amount of impurity phases appear.

In some embodiments, in step (8), drying the washed filter cake is performed at 80-120° C. for 3-5 hours.

In some embodiments, in step (9), the La-doped CaTiO₃ powder is sintered in a vacuum hot-pressing sintering furnace at 1400-1500° C. for 1.5-3 hours, with a vacuum degree of not more than 0.1 Pa, and a press of 20-40 MPa.

The CaTiO₃-based oxide thermoelectric material, and the preparation method thereof as provided in the present disclosure, make it possible to prepare a high-performance n-type oxide thermoelectric material comparable to $CaMnO_3$, $SrTiO_3$, ZnO, etc., from $CaTiO_3$ and have the following advantages compared with the prior art:

1) The $CaTiO_3$-based thermoelectric material prepared by the method of the present disclosure is non-toxic, is harmless, has a good biocompatibility, has a high chemical stability, has corrosion resistance, and can work stably for a long time in a highly corrosive environment.

2) The method of the present disclosure is simple, convenient, low cost, and is suitable for large-scale production.

3) The method of the present disclosure makes it possible to prepare a high-performance $CaTiO_3$-based thermoelectric material comparable to n-type ZnO, $CaTiO_3$, $SrTiO_3$ and other oxide thermoelectric materials. Among them, the La15 sample has a power factor reaching up to 8.2 $\mu W \cdot cm^{-1} \cdot K^{-2}$ (at about 1000 K), and a power factor reaching up to 9.2 $\mu W \cdot cm^{-1} \cdot K^{-2}$ at room temperature (about 300 K), and a conductivity reaching up to 2015 $Scm^{-1}$ (at 300 K), thereby achieving record high thermoelectric performance among calcium titanate ceramics.

DETAILED DESCRIPTION OF THE EMBODIMENTS

Figure 1:
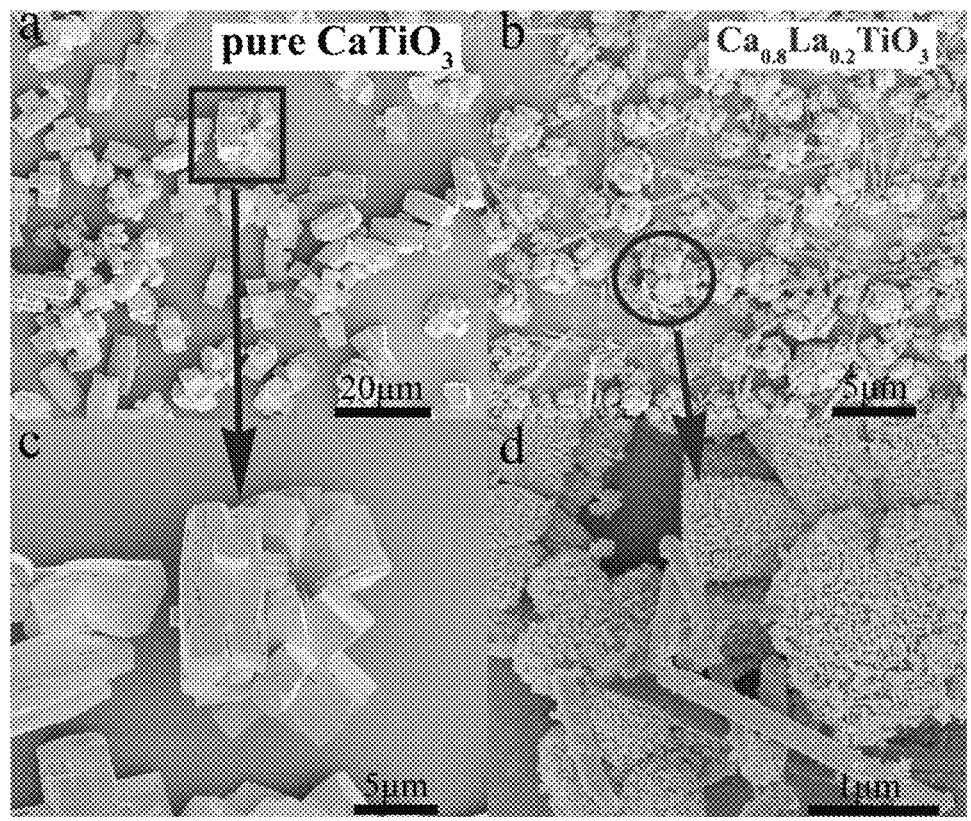
FIG. 1 shows scanning electron microscope (SEM) images of $CaTiO_3$ powder as prepared in Example 1 and $Ca_{0.8}La_{0.2}TiO_3$ as prepared in Example 2, in which, (a) shows a first SEM image of pure $CaTiO_3$ powder, (b) shows a first SEM image of $Ca_{0.8}La_{0.2}TiO_3$, (c) shows a second SEM image of pure $CaTiO_3$ powder, and (d) shows a second SEM image of $Ca_{0.8}La_{0.2}TiO_3$ powder.

The present disclosure will be described in conjunction with the examples below.

EXAMPLE 1

This example discloses a $CaTiO_3$-based oxide thermoelectric material having a chemical formula of $CaTiO_3$ prepared by a method comprising:
(1) weighing 2.21 g of $CaCl_2$ (with a purity of ≥99.99%), dissolving the $CaCL_2$ in 30 mL of distilled water, and stirring for 5 minutes to obtain a uniform aqueous $CaCl_2$ solution;
(2) weighing 7.68 g of NaOH (with a purity of ≥98%), dissolving the NaOH in 30 mL of distilled water, and stirring for 5 minutes to obtain a uniform aqueous NaOH solution;
(3) weighing 6.68 mL of tetrabutyl titanate (with a purity of ≥99%), dissolving the tetrabutyl titanate in 15 mL of ethylene glycol, and stirring for 5-10 minutes to be uniform to obtain a solution of tetrabutyl titanate in ethylene glycol;
(4) adding 15+30 mL of distilled water to the solution of tetrabutyl titanate in ethylene glycol and stirring to obtain a suspension, and adding the aqueous $CaCl_2$ solution and the aqueous NaOH solution in sequence, the resulting mixture being stirred for 10-15 minutes to obtaining a uniform precursor solution;
(5) placing the precursor solution into an autoclave, and moving the autoclave into a drying box kept at 180° C. for 24 hours to obtain a solid product;
(6) adding the solid product into 100 mL of a mixed solution of glacial acetic acid and distilled water in a volume ratio of 1:10, and stirring, and filtering to obtain a filter cake; the filter cake being washed with distilled water for 3 to 5 times, and dried to obtain a $CaTiO_3$ powder having a chemical composition of $CaTiO_3$; and
(7) sintering the $CaTiO_3$ powder in a vacuum hot-pressing sintering furnace at 1500° C. for 2 hours, with a vacuum degree of not more than 0.1 Pa, a press of 20 MPa to obtain a $CaTiO_3$-based thermoelectric ceramic sheet, i.e. a ceramic sheet with a chemical formula of $CaTiO_3$ (also referred to as $CaTiO_3$ ceramic sheet), wherein the vacuum degree reaches ≤0.1 Pa at a high temperature.

EXAMPLE 2

In this example, a $CaTiO_3$-based oxide thermoelectric material having a nominal chemical formula of $Ca_{0.8}La_{0.2}TiO_3$, is prepared by a method comprising:
(1) weighing 1.71 g of $La(NO_3)_3 \cdot 6H_2O$ (with a purity of ≥99.99%) and dissolving the $La(NO_3)_3 \cdot 6H_2O$ in 30 mL of distilled water, and stirring for 5 minutes to obtain an aqueous $La(NO_3)_3 \cdot 6H_2O$ solution;
(2) weighing 1.77 g of $CaCl_2$ (with a purity of ≥99.99%) and dissolving the $CaCl_2$ in 30 mL of distilled water, and stirring for 5 minutes to obtain a uniform aqueous $CaCl_2$ solution;
(3) weighing 7.68 g of NaOH and dissolving the NaOH in 30 mL of distilled water (with a purity of ≥98%), and stirring for 5 minutes to obtain a uniform aqueous NaOH solution;
(4) dissolving 6.68 mL of tetrabutyl titanate (with a purity of ≥99%) in 15 mL of ethylene glycol, and stirring for 5-10 minutes to be uniform to obtain a solution of tetrabutyl titanate in ethylene glycol;
(5) adding 15 mL of distilled water to the solution of tetrabutyl titanate in ethylene glycol, and stirring to obtain a suspension, and adding the aqueous $La(NO_3)_3 \cdot 6H_2O$ solution, the aqueous $CaCl_2$ solution, and the aqueous NaOH solution in sequence, and stirring for 10-15 minutes to obtain a uniform precursor solution;
(6) placing the precursor solution in an autoclave, and moving the autoclave into a dry box kept at 180° C. for 24 hours to obtain a solid product;
(7) adding the solid product into 100 mL of a mixed solution of glacial acetic acid and distilled water in a volume ratio of 1:10, and stirring and filtering to obtain a filter cake; the filter cake being washed with distilled water for 3 to 5 times and dried to obtain a La-doped $CaTiO_3$ powder or a $CaTiO_3$ powder with a small amount of $La(OH)_3$, i.e. a powder having a nominal chemical formula of $Ca_{0.8}La_{0.2}TiO_3$ (nominal composition), also referred to as $Ca_{0.8}La_{0.2}TiO_3$ powder; and
(8) sintering the $Ca_{0.8}La_{0.2}TiO_3$ powder in a vacuum hot-pressing sintering furnace at 1500° C. for 2 hours, with a vacuum degree of ≤0.1 Pa, a press of 20 MPa to obtain a $CaTiO_3$-based thermoelectric ceramic sheet, i.e. a ceramic sheet having a nominal chemical formula of $Ca_{0.8}La_{0.2}TiO_3$ (also referred to as $Ca_{0.8}La_{0.2}TiO_3$ ceramic sheet), wherein the degree of vacuum reached ≤0.1 Pa at a high temperature.

Figure 2:
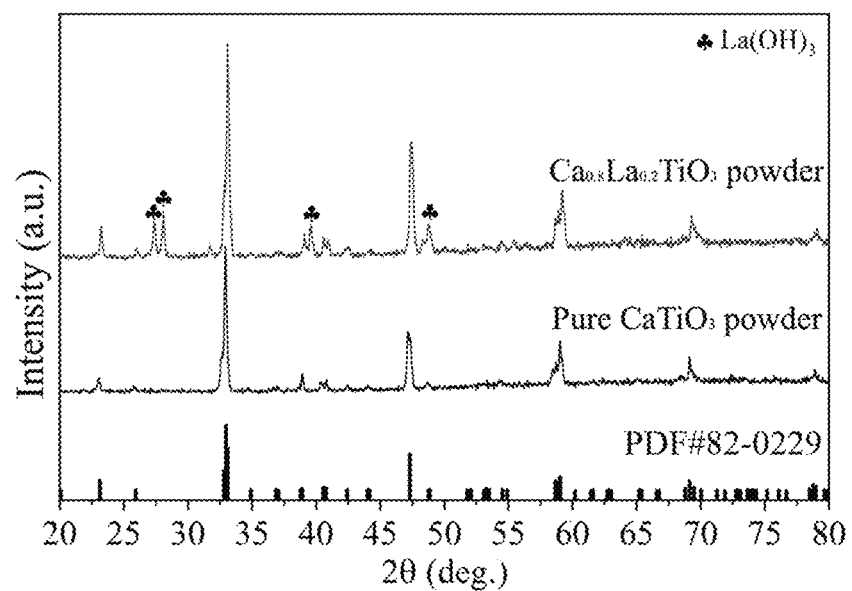
FIG. 2 shows X-ray diffraction (XRD) patterns of powder materials as prepared in Examples 1 and 2.
Figure 3:
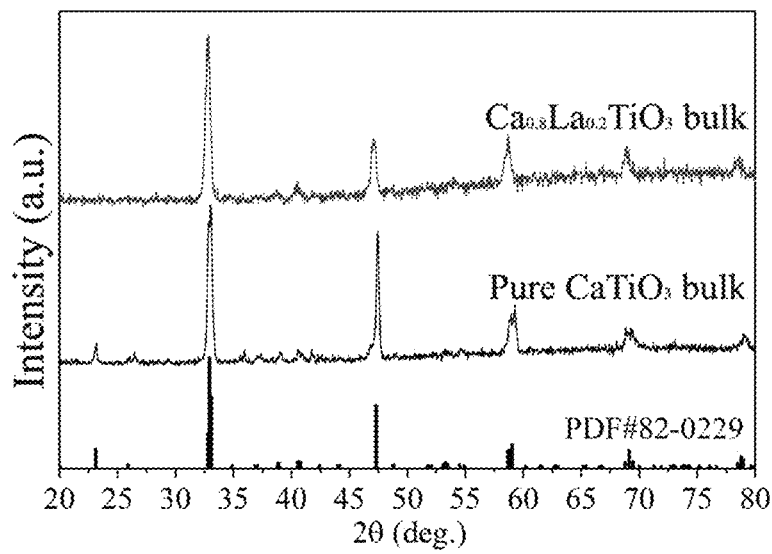
FIG. 3 shows XRD patterns of bulk materials as prepared in Examples 1 and 2.

The $CaTiO_3$ material in Example 1 and $Ca_{0.8}La_{0.2}TiO_3$ material in Example 2 have been characterized, and the results are shown in FIG. 1 to FIG. 3.

FIG. 2 shows X-ray diffraction (XRD) patterns of the pure $CaTiO_3$ powder as prepared in Example 1 and the $Ca_{0.8}La_{0.2}TiO_3$ powder as prepared in Example 2. The XRD patterns of the pure $CaTiO_3$ powder were in good agreement with the standard PDF card and no impurity peak can be identified. When the La-doping concentration was 20%, a small amount of $La(OH)_3$ impurity could be detected in the powder, but the main peaks still were indexed as $CaTiO_3$. The impurity $La(OH)_3$ disappeared and the La element entered the lattice of $CaTiO_3$ after being hot-pressing sintered at 1500° C. under vacuum, so the XRD patterns of bulk $Ca_{0.8}La_{0.2}TiO_3$ in FIG. 3 were indexed exhibited as a single $CaTiO_3$. FIG. 1 shows scanning electron microscope (SEM) images of the two powders, in which pure $CaTiO_3$ powder particles display a shape of laths or cross-shaped laths, with a size of about 10 μm, while La-doped $CaTiO_3$ powder particles have a smaller particle size, about 5 μm. Thus, the aforementioned results show that La doping greatly affects the size and shape of the particles, allowing them to be more easily sintered into a bulk with a high power factor.

EXAMPLE 3

In this example, a $CaTiO_3$-based oxide thermoelectric material having a nominal chemical formula of $Ca_{0.85}La_{0.15}TiO_3$ is prepared by a method comprising:
(1) weighing 1.31 g of $La(NO_3)_3 \cdot 6H_2O$ (with a purity of ≥99.99%) and dissolving the $La(NO_3)_3 \cdot 6H_2O$ in 30 mL of distilled water, and stirring for 5 minutes to obtain an aqueous $La(NO_3)_3 \cdot 6H_2O$ solution;
(2) weighing 1.88 g of $CaCl_2$ (with a purity of ≥99.99%) and dissolving the $CaCl_2$ in 30 mL of distilled water, and stirring for 5 minutes to obtain a uniform aqueous $CaCl_2$ solution;
(3) weighing 7.68 g of NaOH and dissolving the NaOH in 30 mL of distilled water (with a purity of ≥98%), and stirring for 5 minutes to obtain a uniform aqueous NaOH solution;
(4) dissolving 6.68 mL of tetrabutyl titanate (with a purity of ≥99%) in 15 mL of ethylene glycol, and stirring for 5-10 minutes to be uniform to obtain a solution of tetrabutyl titanate in ethylene glycol.
(5) adding 15 mL of distilled water to the solution of tetrabutyl titanate in ethylene glycol, and stirring to obtain a suspension, and adding the aqueous $La(NO_3)_3 \cdot 6H_2O$ solution, the aqueous $CaCl_2$ solution, and the aqueous NaOH solution in sequence, and stirring for 10-15 minutes to obtain a uniform precursor solution;
(6) placing the precursor solution in an autoclave, and moving the autoclave into a dry box kept at 180° C. for 24 hours to obtain a solid product;
(7) adding the solid product into 100 mL of a mixed solution of glacial acetic acid and distilled water in a volume ratio of 1:10, and stirring, and filtering to obtain a filter cake; the filter cake being washed with distilled water for 3 to 5 times, and dried to obtain a La-doped $CaTiO_3$ powder or a $CaTiO_3$ powder with a small amount of $La(OH)_3$, i.e. a powder having a nominal chemical formula of $Ca_{0.85}La_{0.15}TiO_3$ (nominal composition), also referred to as $Ca_{0.85}La_{0.15}TiO_3$ powder; and
(8) sintering the $Ca_{0.85}La_{0.15}TiO_3$ powder in a vacuum hot-pressing sintering furnace at 1500° C. for 2 hours, with a vacuum degree of ≤0.1 Pa, a press of 20 MPa, obtaining a $CaTiO_3$-based thermoelectric ceramic sheet, i.e. a ceramic sheet having a nominal chemical formula of $Ca_{0.85}La_{0.15}TiO_3$ (also referred to as $Ca_{0.85}La_{0.15}TiO_3$ ceramic sheet), wherein the degree of vacuum reached ≤0.1 Pa at a high temperature.

EXAMPLE 4

In this example, a $CaTiO_3$-based oxide thermoelectric material having a nominal chemical formula of $Ca_{0.9}La_{0.1}TiO_3$ is prepared by a method comprising:
(1) weighing 0.866 g of $La(NO_3)_3 \cdot 6H_2O$ (with a purity of ≥99.99%) and dissolving the $La(NO_3)_3 \cdot 6H_2O$ in 30 mL of distilled water, and stifling for 5 minutes to obtain an aqueous $La(NO_3)_3 \cdot 6H_2O$ solution;
(2) weighing 1.99 g of $CaCl_2$ (with a purity of ≥99.99%) was weighed and dissolving the $CaCl_2$ in 30 mL of distilled water, and stifling for 5 minutes to obtain a uniform aqueous $CaCl_2$ solution;
(3) weighing 7.68 g of NaOH was weighed and dissolving NaOH the in 30 mL of distilled water (with a purity of ≥98%), and stirring for 5 minutes to obtain a uniform aqueous NaOH solution;
(4) dissolving 6.68 mL of tetrabutyl titanate (with a purity of ≥99%) in 15 mL of ethylene glycol, and stifling for 5-10 minutes to be uniform, and obtaining a solution of tetrabutyl titanate in ethylene glycol;
(5) adding 15 mL of distilled water to the solution of tetrabutyl titanate in ethylene glycol, and stifling to obtain a suspension, and adding the aqueous $La(NO_3)_3 \cdot 6H_2O$ solution, the aqueous $CaCl_2$ solution, and the aqueous NaOH solution in sequence, and stifling for 10-15 minutes to obtain a uniform precursor solution;
(6) placing the precursor solution in an autoclave, and moving the autoclave into a dry box kept at 180° C. for 24 hours to obtain a solid product;
(7) the solid product being added into 100 mL of a mixed solution of glacial acetic acid and distilled water in a volume ratio of 1:10, and stirring, and filtered to obtain a filter cake; the filter cake being washed with distilled water for 3 to 5 times, and dried to obtain a La-doped $CaTiO_3$ powder or a $CaTiO_3$ powder with a small amount of $La(OH)_3$, i.e. a powder having a nominal chemical formula of $Ca_{0.9}La_{0.1}TiO_3$ (nominal composition), also referred to as $Ca_{0.9}La_{0.1}TiO_3$ powder; and
(8) sintering he $Ca_{0.9}La_{0.1}TiO_3$ powder in a vacuum hot-pressing sintering furnace at 1500° C. for 2 hours, with a vacuum degree of ≤0.1 Pa, a press of 20 MPa to obtain a $CaTiO_3$-based thermoelectric ceramic sheet, i.e. a ceramic sheet having a nominal chemical formula of $Ca_{0.9}La_{0.1}TiO_3$ (also referred to as $Ca_{0.9}La_{0.1}TiO_3$ ceramic sheet), wherein the degree of vacuum reached ≤0.1 Pa at a high temperature.

EXAMPLE 5

In this example, a $CaTiO_3$-based oxide thermoelectric material having a nominal chemical formula of $Ca_{0.95}La_{0.05}TiO_3$, is prepared by a method comprising;
(1) weighing 0.433 g of $La(NO_3)_3 \cdot 6H_2O$ (with a purity of ≥99.99%) and dissolving the $La(NO_3)_3 \cdot 6H_2O$ in 30 mL of distilled water, and stirring for 5 minutes to obtain an aqueous $La(NO_3)_3 \cdot 6H_2O$ solution;

(2) weighing 2.1 g of CaCl$_2$ (with a purity of ≥99.99%) and dissolving the CaCl$_2$ in 30 mL of distilled water, and stirring for 5 minutes to obtain a uniform aqueous CaCl$_2$ solution;

(3) weighing 7.68 g of NaOH dissolving the NaOH in 30 mL of distilled water (with a purity of ≥98%), and stirring for 5 minutes to obtain a uniform aqueous NaOH solution;

(4) dissolving 6.68 mL of tetrabutyl titanate (with a purity of ≥99%) in 15 mL of ethylene glycol, and stirring for 5-10 minutes to be uniform to obtain a solution of tetrabutyl titanate in ethylene glycol;

(5) adding 15 mL of distilled water to the solution of tetrabutyl titanate in ethylene glycol, and stirring to obtain a suspension, and adding the aqueous La(NO$_3$)$_3$·6H$_2$O solution, the aqueous CaCl$_2$ solution, and the aqueous NaOH solution in sequence, and stirring for 10-15 minutes to obtain a uniform precursor solution;

(6) placing the precursor solution in an autoclave, and moving the autoclave into a dry box kept at 180° C. for 24 hours to obtain a solid product;

(7) adding the solid product into 100 mL of a mixed solution of glacial acetic acid and distilled water in a volume ratio of 1:10, and stirring, and filtering to obtain a filter cake; the filter cake being washed with distilled water for 3 to 5 times, and dried to obtain a La-doped CaTiO$_3$ powder or a CaTiO$_3$ powder with a small amount of La(OH)$_3$, i.e. a powder having a nominal chemical formula of Ca$_{0.95}$La$_{0.05}$TiO$_3$ (nominal composition), also referred to as Ca$_{0.95}$La$_{0.05}$TiO$_3$ powder; and (8) sintering the Ca$_{0.95}$La$_{0.05}$TiO$_3$ powder in a vacuum hot-pressing sintering furnace at 1500° C. for 2 hours, with a vacuum degree of ≤0.1 Pa, a press of 20 MPa, obtaining a CaTiO$_3$-based thermoelectric ceramic sheet, i.e., a ceramic sheet having a nominal chemical formula of Ca$_{0.95}$La$_{0.05}$TiO$_3$ (also referred to as Ca$_{0.85}$La$_{0.15}$TiO$_3$ ceramic sheet), wherein the degree of vacuum reached ≤0.1 Pa at a high temperature.

Figure 4:
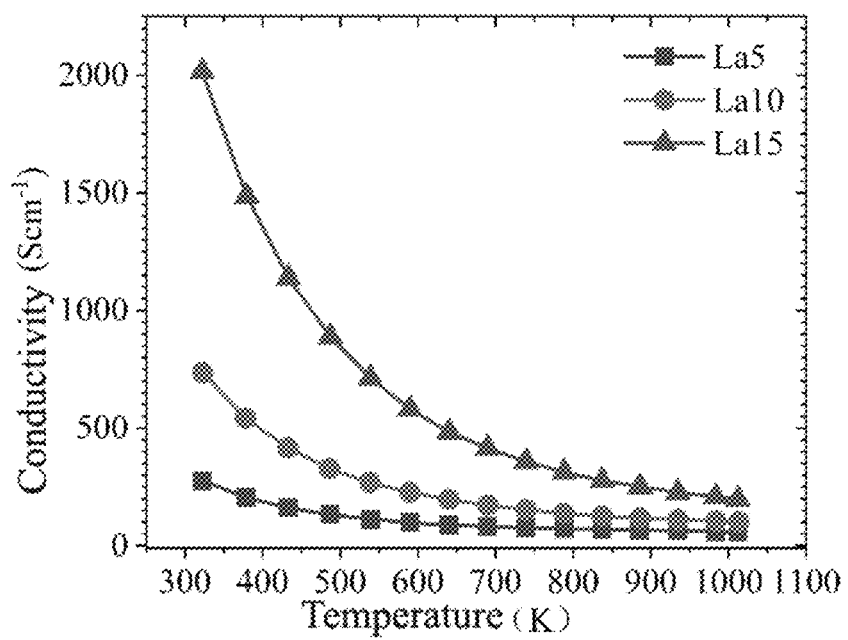
FIG. 4 shows a temperature dependent electronic conductivity of ceramic sheets as prepared in Examples 3, 4, and 5.
Figure 5:
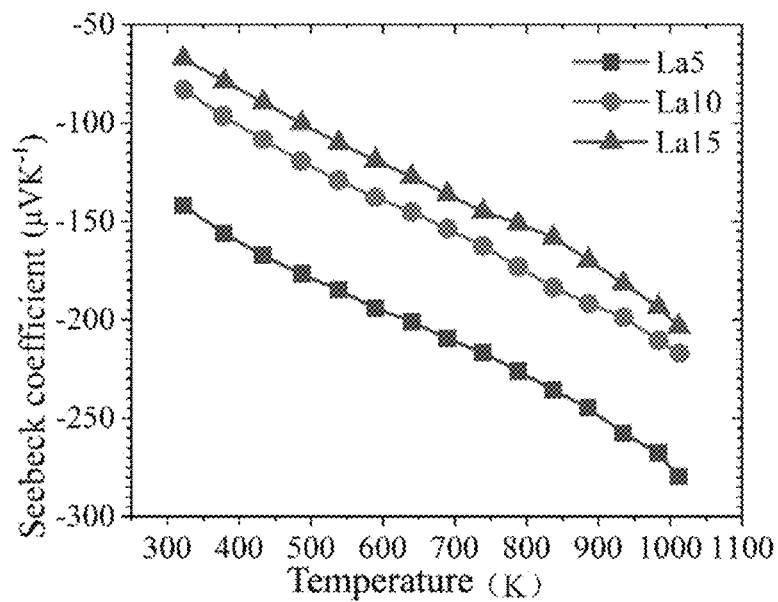
FIG. 5 shows a temperature dependent Seebeck coefficient of ceramic sheets as prepared in Examples 3, 4, and 5.
Figure 6:
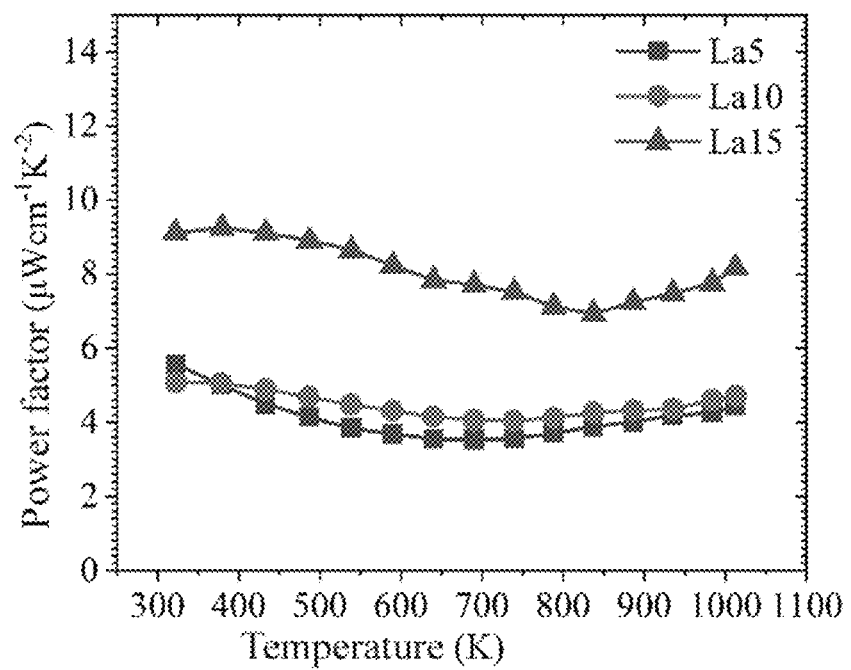
FIG. 6 shows a temperature dependent power factor of ceramic sheets as prepared in Examples 3, 4, and 5.

The Ca$_{0.85}$La$_{0.15}$TiO$_3$ ceramic sheet as prepared in Example 3, the Ca$_{0.9}$La$_{0.1}$TiO$_3$ ceramic sheet as prepared in Example 4 and the Ca$_{0.95}$La$_{0.05}$TiO$_3$ ceramic sheet as prepared in Example 5 are characterized, and the results shown in FIG. 4 to FIG. 6.

FIG. 4 shows a temperature dependent electrical conductivity of: (1) a Ca$_{0.85}$La$_{0.15}$TiO$_3$ ceramic sheet (referred as La15 for short) as prepared in Example 3; (2) a Ca$_{0.9}$La$_{0.1}$TiO$_3$ ceramic sheet (referred as La10 for short) as prepared in Example 4; and (3) a Ca$_{0.95}$La$_{0.05}$TiO$_3$ ceramic sheet (referred as La5 for short) as prepared in Example 5, showing that the conductivity decreases with the increase of temperature, in which La15 sample shows a high conductivity.

FIG. 5 shows a temperature dependent Seebeck coefficient of: (1) a Ca$_{0.85}$La$_{0.15}$TiO$_3$ ceramic sheet (referred as La15 for short) as prepared in Example 3; (2) a Ca$_{0.9}$La$_{0.1}$TiO$_3$ ceramic sheet (referred as La10 for short) as prepared in Example 4; and (3) a Ca$_{0.95}$La$_{0.05}$TiO$_3$ ceramic sheet (referred as La5 for short) as prepared in Example 5, in which all samples exhibit a negative Seebeck coefficient, indicating that the CaTiO$_3$ ceramic sheets as prepared by the method of the present disclosure show a typical n-type thermoelectric material.

FIG. 6 shows a temperature dependent power factor of: (1) a Ca$_{0.85}$La$_{0.15}$TiO$_3$ ceramic sheet (referred as La15 for short) as prepared in Example 3; (2) a Ca$_{0.9}$La$_{0.1}$TiO$_3$ ceramic sheet (referred as La10 for short) as prepared in Example 4; and (3) a Ca$_{0.95}$La$_{0.05}$TiO$_3$ ceramic sheet (referred as La5 for short) as prepared in Example 5, in which La15 sample shows a fairly high power factor in the whole temperature range, and a power factor of 8.17 μWcm$^{-1}$K$^{-2}$ at 1000 K, showing that a high performance n-type thermoelectric material can be successfully prepared by the method of the present disclosure from CaTiO$_3$ oxide.

It should be noted that the above embodiments are only used to illustrate the technical solutions of the present disclosure, but not to limit them; although the present disclosure has been described in detail with reference to the foregoing embodiments, those of ordinary skill in the art should understand that it is still possible to modify the technical solutions described in the foregoing embodiments, or equivalently replace some or all of the technical features; and that inclusion of these modifications or replacements and any resulting embodiments nonetheless fall within the scope of technical solutions of the present disclosure.

What is claimed is:

1. A method for preparing a CaTiO$_3$-based oxide thermoelectric material, the CaTiO$_3$-based oxide thermoelectric material having a chemical formula of Ca$_{1-x}$La$_x$TiO$_3$, where $0<x\leq 0.4$;

the method, comprising:
(1) dissolving La(NO$_3$)$_3$·6H$_2$O in distilled water and stirring for 5-10 minutes, to obtain an aqueous La(NO$_3$)$_3$·6H$_2$O solution;
(2) dissolving CaCl$_2$ in distilled water and stirring for 5-10 minutes, to obtain an aqueous CaCl$_2$ solution;
(3) dissolving NaOH in distilled water and stirring for 5-10 minutes, to obtain an aqueous NaOH solution;
(4) dissolving tetrabutyl titanate in ethylene glycol and stirring for 5-10 minutes, to obtain a solution of tetrabutyl titanate in ethylene glycol;
(5) adding distilled water to the solution of tetrabutyl titanate in ethylene glycol, stirring to obtain a suspension, and adding the aqueous La(NO$_3$)$_3$·6H$_2$O solution, the aqueous CaCl$_2$ solution, and the aqueous NaOH solution in sequence into the suspension, and stirring for 10-15 minutes, to obtain a precursor solution, wherein a molar ratio of the La(NO$_3$)$_3$·6H$_2$O, the CaCl$_2$, the tetrabutyl titanate, and the NaOH is in a range of x: (1−x): 1:10, with the proviso that $0<x\leq 0.4$;
(6) placing the precursor solution into an autoclave, moving the autoclave into a drying box, and keeping at 160-200° C. for 6-24 hours, to obtain a solid product;
(7) mixing glacial acetic acid and distilled water in a glacial acetic acid-to-distilled water volume ratio of 1: (5-15), and stirring for 3-5 minutes, to obtain a mixed solution of glacial acetic acid and distilled water;
(8) adding the solid product into the mixed solution of glacial acetic acid and distilled water, wherein a ratio of the solid product to the mixed solution is in a range of 2-4 g: 100 mL; stirring, and filtering, to obtain a filter cake, washing the filter cake with distilled water for 3 to 5 times, and drying the washed filter cake, to obtain a La-doped CaTiO$_3$ powder; and
(9) sintering the La-doped CaTiO$_3$ powder in a vacuum hot-pressing sintering furnace at 1300 to 1600° C. for 1-3 hours, with a vacuum degree of not more than 0.1 Pa, and a press pressure of 10 to 40 MPa, to obtain the CaTiO$_3$-based oxide thermoelectric material;

wherein steps (1) to (4) are performed in any order; and there is no time sequence limitation between step (7) and any one of steps (1) to (6).

2. The method of claim 1, wherein the aqueous La$(NO_3)_3 \cdot 6H_2O$ solution has a La$(NO_3)_3 \cdot 6H_2O$ concentration of not more than 0.27 mol/L.

3. The method of claim 1, wherein the aqueous $CaCl_2$ solution has a $CaCl_2$ concentration of 0.4-0.67 mol/L.

4. The method of claim 1, wherein the aqueous NaOH solution has a NaOH concentration of 4.5-7 mol/L.

5. The method of claim 1, wherein in step (4) the solution of tetrabutyl titanate in ethylene glycol has a tetrabutyl titanate concentration of 0.1-1.5 mol/L.

6. The method of claim 1, wherein a volume ratio of ethylene glycol to distilled water in the precursor solution in step (5) is in a range of (1-3):7.

7. The method of claim 1, wherein a volume ratio of distilled water to ethylene glycol in the suspension in step (5) is larger than or equal to 1:1.

8. The method of claim 1, wherein, in step (9), sintering the La-doped $CaTiO_3$ powder in the vacuum hot-pressing sintering furnace is performed at 1400-1500° C. for 1.5-3 hours, with the vacuum degree of not more than 0.1 Pa, and the pressure of 20-40 MPa.

* * * * *